United States Patent [19]

Ishii et al.

[11] Patent Number: 4,955,649
[45] Date of Patent: Sep. 11, 1990

[54] APPARATUS FOR HOLDING PLATES

[75] Inventors: Katsumi Ishii, Fujino; Yasushi Sasaki, Atsugi, both of Japan

[73] Assignee: Tel Sagami Limited, Kanagawa, Japan

[21] Appl. No.: 312,603

[22] Filed: Feb. 21, 1989

[30] Foreign Application Priority Data

Feb. 29, 1988 [JP] Japan .................. 63-46482

[51] Int. Cl.$^5$ .............................. A47F 13/06
[52] U.S. Cl. ............................ 294/1.1; 294/27.1
[58] Field of Search ............ 294/1.1, 6, 27.1, 33, 294/99.1

[56] References Cited

U.S. PATENT DOCUMENTS

| | | | |
|---|---|---|---|
| 2,723,877 | 11/1955 | Palmour et al. | 294/28 X |
| 3,274,658 | 9/1966 | Pile | 294/99.1 X |
| 3,365,227 | 1/1968 | Wildgen | 294/27.1 |
| 4,173,427 | 11/1979 | Beuch et al. | 294/99.1 X |
| 4,248,465 | 2/1981 | Halstead | 294/99.1 X |
| 4,452,480 | 6/1984 | Maier et al. | 294/27.1 X |
| 4,496,180 | 1/1985 | Hillman et al. | 294/64.1 |
| 4,819,789 | 4/1989 | Linnér | 294/99.1 X |
| 4,848,814 | 7/1989 | Suzuki et al. | 294/1.1 |

FOREIGN PATENT DOCUMENTS

| | | | |
|---|---|---|---|
| 487714 | 3/1928 | Fed. Rep. of Germany | 294/1.1 |
| 61-33443 | 2/1986 | Japan . | |
| 61-212014 | 9/1986 | Japan . | |
| 63-37614 | 2/1988 | Japan . | |
| 63-37615 | 2/1988 | Japan . | |
| 63-37629 | 2/1988 | Japan . | |
| 63-58920 | 3/1988 | Japan . | |
| 63-190173 | 8/1988 | Japan . | |
| 63-207134 | 8/1988 | Japan . | |

*Primary Examiner*—Margaret A. Focarino
*Assistant Examiner*—Gary C. Hoge
*Attorney, Agent, or Firm*—Oblon, Spivak, McClelland, Maier & Neustadt

[57] ABSTRACT

The apparatus comprises a first holding member having a flat surface which is brought into contact with the nonprocess surface of the semiconductor wafer, a pair of second holding members having inclined surfaces which are spaced apart from said flat surface by a predetermined distance, and cooperate with the flat surface to receive the arcuated edge of the semiconductor wafer. The second holding members are spaced apart from each other in a direction perpendicular to a semiconductor wafer insertion direction. The inclined surfaces being inclined such that a distance between the inclined surfaces and the flat surface is decreased in the semiconductor wafer insertion direction, thereby clamping the arcuated edge portions of the semiconductor wafer.

5 Claims, 4 Drawing Sheets

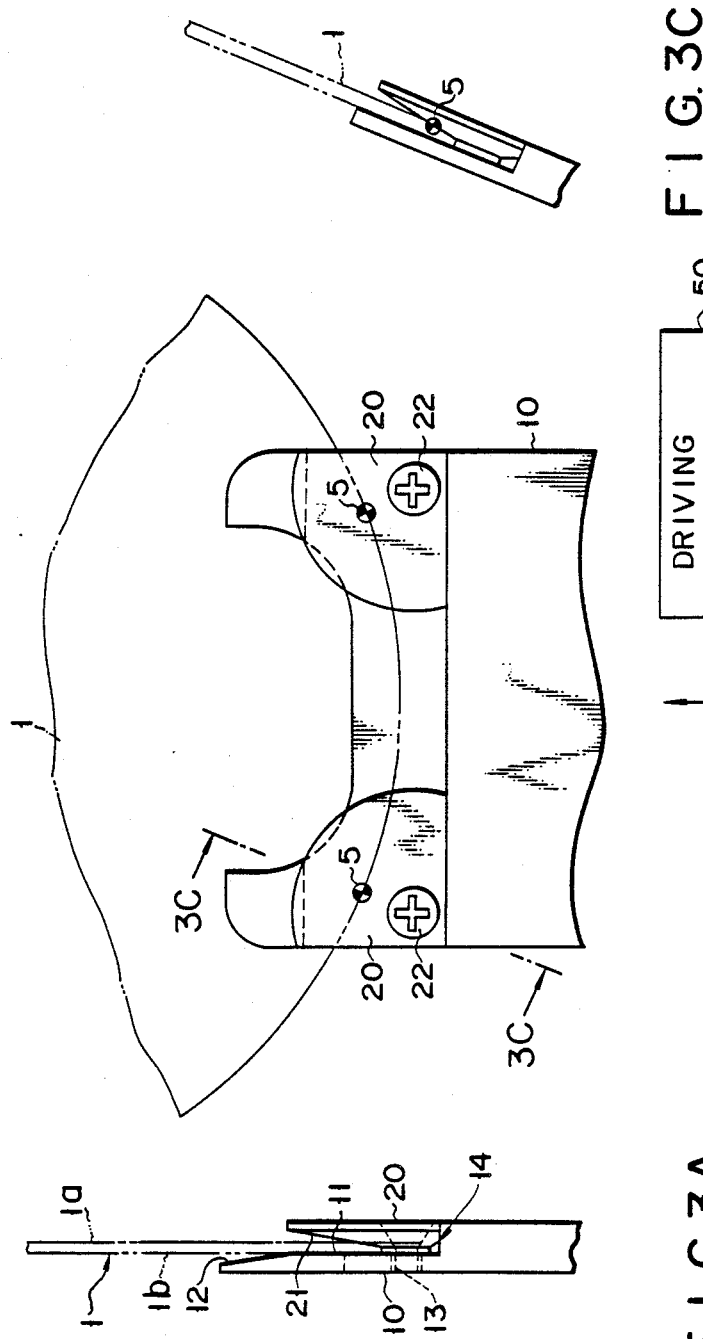

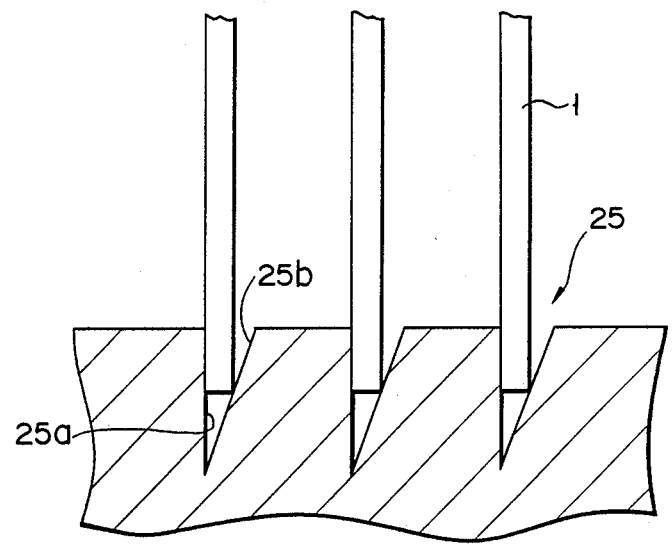
F I G. 5

APPARATUS FOR HOLDING PLATES

BACKGROUND OF THE INVENTION

1. Field of the Invention

The present invention relates to an apparatus for holding plates such as semiconductor wafers having different sizes and thicknesses by a common holding portion.

2. Description of the Related Art

A conventional semiconductor wafer holding apparatus as a typical holding apparatus of this type is shown in FIGS. 1A and 1B. This holding apparatus vertically moves or conveys semiconductor wafers 1. A blade 2 constituting a holding portion has an arcuated upper edge 4 so as to match with a peripheral curve (almost an arc) of the wafer 1, as shown in FIG. 1A. A vertically tapered concave groove 3 is formed to receive and support the edge of the wafer 1 as shown in a sectional view of FIG. 1B along the line 1B—1B of FIG. 1A. Therefore, the edge of the wafer 1 is held in the groove 3. The holding apparatus is used to take up the wafer and hold it in a vertical state or, to hold or move a plurality of wafers, for example twenty five wafers taken out from a wafer carrier or wafer boat, at the same time in a manner that the wafers are kept at regular intervals and in horizontal states.

The groove 3 is set to have a width slightly larger than a maximum width of the wafer 1 in consideration of a tolerance. The holding apparatus described above presents the following various problems.

A. Since the opening width of the groove 3 is considerably larger than a normal wafer thickness, the normal wafer cannot be stably supported at the upper end of the holding portion, resulting in poor positioning precision.

B. In order to precisely match the width of the groove 3 with a wafer thickness, an allowance for a tolerance of groove formation becomes strict, and an exclusive jig for forming a groove is required, resulting in high cost.

C. A process surface of a wafer is brought into contact with a side surface of the groove 3 although a contact area is small.

D. Since there is no element for fixing a wafer, the wafer surface slightly vibrates in a direction parallel to the wafer surface and a direction perpendicular thereto.

SUMMARY OF THE INVENTION

It is an object of the present invention to provide a plate holding apparatus capable of improving holding precision of a plate, assuring versatility for appropriately holding plates regardless of their sizes and thicknesses, and reducing the manufacturing cost.

The plate holding apparatus according to the present invention holds a plate by clamping it between a flat surface and an inclined surface opposite thereto.

A plurality of inclined surfaces spaced apart from each other are preferably formed at positions opposite to the flat surface. In addition, the holding apparatus can also serve as a container. In this case, plate holding grooves of the container can be constituted by combinations of the flat surface and the inclined surfaces.

The plate is held such that its one major surface is in contact with the flat surface, and edge portions of the other major surfaces are in contact with the inclined surfaces. At contact points (reaction points) of the plate on the inclined surfaces, a horizontal-component reaction force Rh of the weight of the plate acts as a force for urging the plate against the flat surface, and a rotational moment M for urging the plate against the flat surface is produced by an offset H between a gravitational direction of the plate and the reaction point, as shown in FIG. 2. Therefore, the plate is kept urged against the flat surface, and the center of the plate is not deviated from a reference position. The plate is not moved by external vibrations and is therefore appropriately held.

The opposite surface portion of the holding portion is constituted by inclined surfaces. These inclined surfaces serve as guides for holding the plate. When the size, especially thickness, of the plate is changed, the positions of the reaction points are changed. The principle of holding the plates is not kept unchanged. Therefore, the plate holding apparatus according to the present invention has versatility which allows common use of the apparatus for various types of plates.

BRIEF DESCRIPTION OF THE DRAWINGS

FIGS. 3A to 3C are a side view of a holding apparatus according to an embodiment of the present invention, a front view thereof, and a cross-sectional view thereof along the line 3C—3C of FIG. 3B, respectively;

FIGS. 4A to 4C are views for explaining a theory holding of the holding apparatus of the present invention, in which FIGS. 4A and 4B are front views of a wafer, and FIG. 4C is a graph showing a relationship between a reaction point and an external force/wafer weight; and FIG. 5 is a sectional view showing a holding apparatus formed in a cassette or boat.

DETAILED DESCRIPTION OF THE PREFERRED EMBODIMENT

Figure 2:
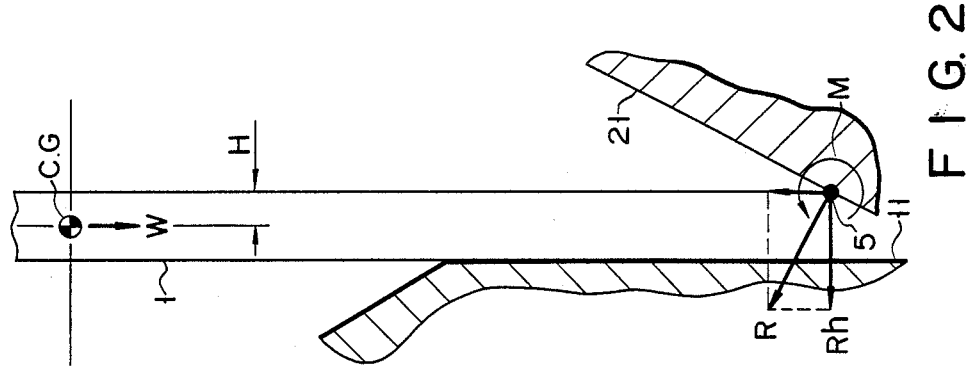
FIG. 2 is a view for explaining the principle of holding of a holding apparatus according to an embodiment of the present invention.
Figure 1B:
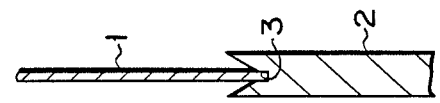
FIGS. 1A and 1B are a front view showing a conventional holding apparatus and a sectional view thereof along the line 1B—1B of FIG. 1A, respectively.
Figure 1A:
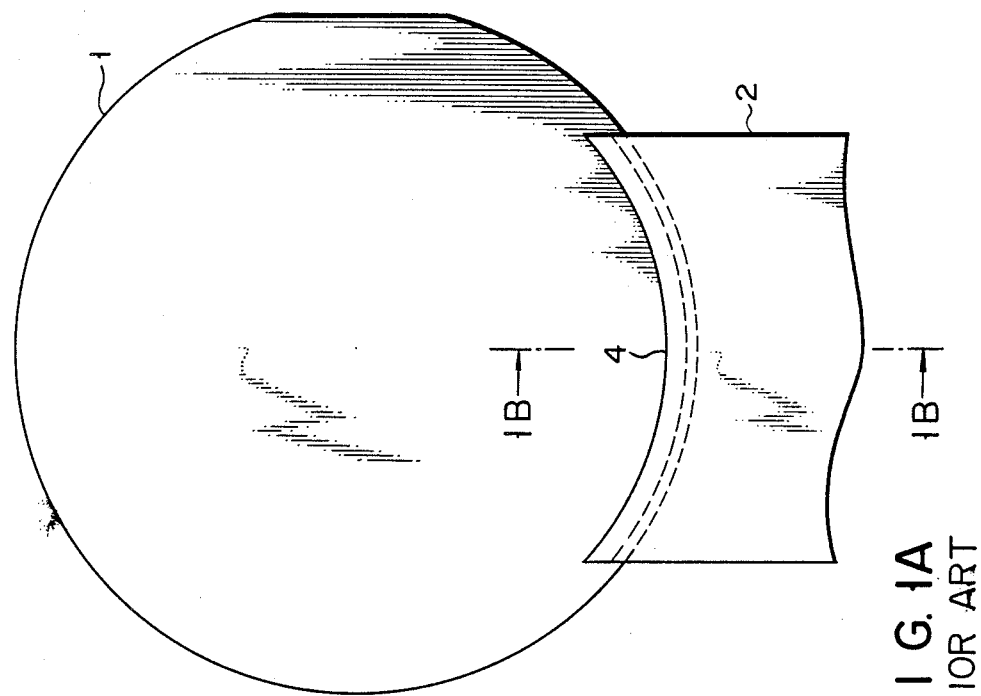

A holding apparatus according to a preferred embodiment of the present invention applied to a semiconductor wafer push-up apparatus will be described in detail with reference to the accompanying drawings.

The push-up apparatus vertically holds each, some, or all of a plurality of vertically held semiconductor wafers in a cassette, pushes the wafers upward (indicated by an arrow) by a driving mechanism 50 (FIG. 3B) and transfers them to a heating furnace loading susceptor. A wafer holding apparatus in the push-up apparatus will be described below.

The holding apparatus comprises a vertical flat member 10 and two inclined surface members 20 which are spaced apart from each other in a direction perpendicular to a semiconductor wafer insertion direction and which are opposite to the vertical flat surface member 10, as shown in FIG. 3A. The two inclined surface members 20 are spaced apart from each other by a predetermined distance to be symmetrical about the vertical flat surface member 10.

A large number of holding apparatuses are arranged in tandem with each other to constitute an assembly. A large number of wafers can be held by the assembly so as to be spaced apart from each other by predetermined intervals. When the assembly is moved, a large number of semiconductor wafers can be simultaneously moved.

The semiconductor wafer 1 as an example of a plate has a diameter of 150 mm and is held such that an arcuated edge of the wafer 1 is clamped between the vertical flat surface member 10 and the opposite inclined surface members 20. The wafer 1 is set such that its process surface 1a is brought into contact with the inclined surface members 20. As shown in FIG. 3C along the line 3C—3C of FIG. 3B, a reaction point 5 as one point of the inclined surface member 20 is brought into contact with the wafer 1. Therefore, the inclined surface members 20 are not brought into contact with the process surface of the wafer 1, and the effective utilization area of the wafer 1 can be increased.

The vertical flat surface member 10 comprises a stepped plate member, as shown in FIG. 3B. A rear surface (nonprocess surface) 1b of the wafer 1 which is opposite to the process surface 1a is brought into contact with an upper vertical flat surface 11. The upper portion of the vertical flat surface 11 is constituted by a tapered surface 12, while the lower portion of the vertical flat surface 11 has two screw holes 13 for mounting the two inclined surface members 20. The stepped portion of the vertical flat member 10 has a horizontal flat surface 14 extending in a direction perpendicular to the vertical flat surface 11.

The inclined surface members 20 are obtained by dividing a frustoconical member into substantially halves along two vertical surfaces perpendicular to each other. More specifically, each inclined surface member 20 comprises a ¼ sector plate having a flat surface portion whose upper surface is located at a corner and an inclined surface portion which is inclined downward along the edge from the flat surface portion. The inclined surface members 20 are mounted by Belleville screws 22 while the inclined surfaces 21 oppose the vertical flat surface 11 and the horizontal end faces are kept in contact with the horizontal flat surface 14 of the vertical flat surface member 10. Accordingly the area below the reaction point 5, as seen in FIG. 3C, acts as an auxiliary inclined surface and is continuous with the inclined surface 21 above the reaction point 5.

The above shape is determined due to manufacturing steps of the inclined surfaces 21. An inclined surface (this surface serves as inclined surfaces 21) is formed on a disk-like member by a lathe and the member is divided into four members in consideration of the width of the holding apparatus. It should be noted that the inclined surface 21 may be an inclined surface of a frustoconical member as in the above embodiment or may be replaced with a flat surface.

The vertical flat surface member 10 and the inclined surface member 20 may be made of various materials such as stainless steel, a material obtained by coating a ceramic material on stainless steel or a material obtained by coating $SiO_2$ on stainless steel. In order to increase a pressure-receiving area and decrease a surface pressure (stress) when small chipping dust of the wafer 1 is produced at the reaction point 5 between each inclined surface 21 and the wafer 1, a material having a low longitudinal modulus (Young's modulus) and a low hardness is preferably selected.

A teflon-reinforced resin can be preferably used in favor of the above consideration. Ethylene trifluoride resin, hard vinyl chloride, a polyethylene-based high-density resin, or ABS resin can also be preferably used as a resin material having mechanical characteristics equivalent to or better than the teflon-reinforced resin.

An angle of the inclined surface 21 of the inclined surface member 20 with respect to the vertical axis is minimized in order to increase a holding force for the wafer 1 (as will be described later). However, if the angle is extremely small, a very large force is required to remove the wafer 1, one end of which is held.

Frictional coefficients of the flat vertical surface 11, the inclined surface 21, and the wafer 1 are considered as follows. When the frictional coefficient is expressed in the form of a tan (tangent) angle, a critical angle is given such that even if the wafer 1 is moved downward, it is not caught by the flat surface 11 and the inclined surfaces 21. A predetermined safety margin is generally added to the critical angle to determine the frictional coefficient. Assume that quartz glass is employed as the above material. Since a frictional coefficient of quartz glass is 0.8, an angle formed by each inclined surface 21 and the horizontal direction is given as about 38° ~ 39°. Here, the angle between the inclined surface 21 and flat vertical surface 11 is about 51° ~ 52°. In consideration of the safety margin, horizontal component Ph an angle formed by the flat vertical surface 11 and each inclined surface 21 is determined to be 10°.

A general upper limit angle between the inclined surface 21 and the flat vertical surface 11 facing the surface 21 is preferably 20° or less although the range slightly varies depending on materials.

An operation will be described below.

FIG. 2 dynamically shows the principle of operation of the holding portion constituted by the vertical flat surface 11 and the inclined surface 21.

When the wafer 1 is inserted between the vertical flat surface 11 and the inclined surface 21, a reaction force R is produced by a weight W of the wafer 1 at the reaction point 5 as a contact position between the wafer 1 and the inclined surface 21. The horizontal component Rh of the reaction force R is obtained to urge the wafer 1 against the vertical flat surface 11. Therefore, it is possible to vertically hold the wafer 1 by the horizontal component Rh of the reaction force.

The rotational moment M is produced by the offset H between the weight W of the wafer 1 and the reaction point 5. The rotational moment M acts to urge the wafer 1 against the vertical flat surface 11.

A cooperative effect of the horizontal-component reaction force Rh and the rotational moment M allows vertical holding of the wafer 1 along the vertical flat surface 11. When the function of the inclined surface 21 and setting of the vertical flat surface are properly determined, a sufficiently large inclined surface reaction force R is obtained.

Two holding portions constituted by the vertical flat surface 11 and the two opposite inclined surfaces 21 are formed to be aligned in the horizontal direction, as shown in FIG. 3B. Holding stability of the wafer in the horizontal direction can be achieved, and at the same time, the large vertical flat surface 11 which is in contact with the wafer 1 surface can be assured. Thus, when the reaction point 5 serves as one fulcrum, vertical flat portions which are in contact with the wafer and which interpose the reaction point 5 therebetween serve as the other fulcrum against vibrations in a direction perpendicular to the surface of the wafer 1, thereby preventing vibrations of the wafer 1 and assuring a vertical holding function.

The function of the inclined surfaces 21 does not only contribute to assurance of the holding force, but also to accurate reception and guide of the wafer 1 by the inclined surfaces 21 when the wafer 1 is inserted between the vertical flat surface 11 and the inclined surfaces 21 of the holding apparatus while being deviated from a proper position.

According to a further effect of this embodiment, even if the size and thickness of the wafer 1 are changed, the wafer 1 can be vertically held although the positions of the reaction points 5 are changed. Therefore, one type of holding apparatus has versatility which allows holding of various types of wafers.

Stability of the wafer 1 by a two-fulcrum support mechanism of the apparatus shown in FIGS. 3A through 3C against right-and-left movement will be described below.

Figure 4A:
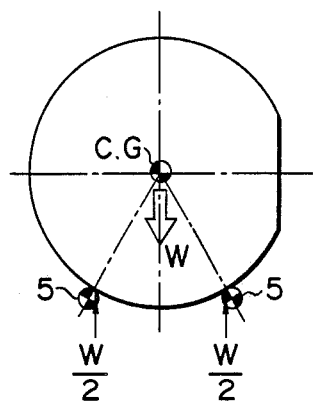

In a normal wafer holding state of this holding apparatus, the weight W of the wafer 1 is shared by the two reaction points 5 as W/2, as shown in FIG. 4A.

Figure 4B:
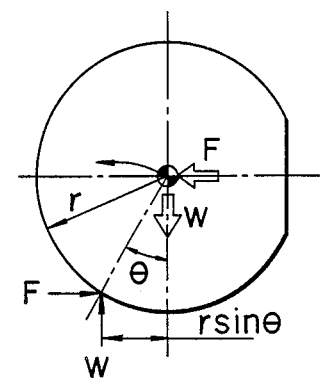

As shown in FIG. 4B, in a balanced state immediately before the wafer 1 is about to move when an external force F such as a lateral load acts on the wafer 1, a balancing state of one reaction point 5 is given as follows:

$$Fr\cos\theta = WR\sin\theta$$

where $\theta$ is the opening angle from the central line of the wafer to the reaction point 5. Condition $F/W = \tan\theta$ is established from the above equation.

The F/W value represents a ratio of an acceleration to $G = 980 cm/sec^2$ as in the case wherein an acceleration is expressed with G (e.g., 0.5 of 0.5G). A relationship between F/W and $\theta$ is shown in FIG. 4C.

Figure 4C:
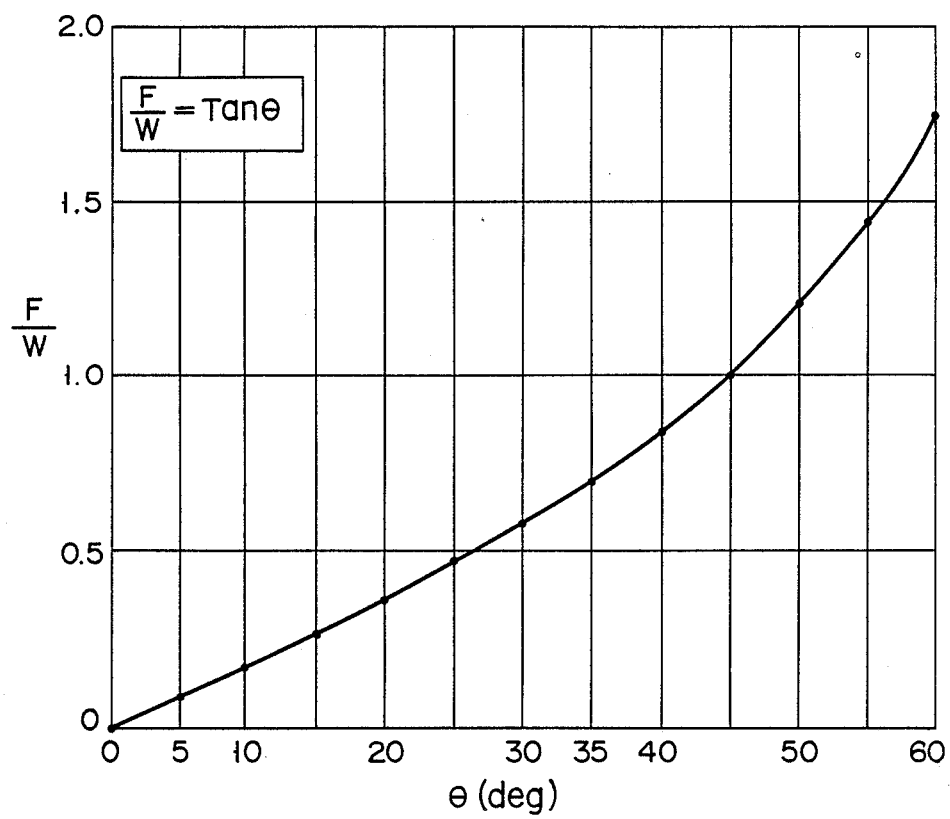

As shown in FIG. 4C, when the angle $\theta$ is increased, it is readily understood that the apparatus can withstand a large lateral load F. In this embodiment, the wafer 1 of a 150 mm diameter can be stably held even if the angle $\theta$ is set to be 21° and a lateral load of about F=0.38 W or a lateral acceleration of about 0.38G is applied. However, if the angle $\theta$ is excessively increased, the wafer process surface may be adversely affected. Therefore, the angle $\theta$ falls preferably within the range of 20° to 40°.

The present invention is not limited to the particular embodiment described above, and various changes and modifications may be made within the spirit and scope of the invention.

The holding apparatus according to the present invention can be used to hold a plate in an inclined or horizontal state in addition to vertically holding the plate as in the above embodiment. In this case, if a horizontal flat surface 11 shown in FIG. 3A is held in an inclined or horizontal state, a sufficient holding force can be assured as compared with a conventional groove type apparatus although the holding force is smaller than the vertical holding force.

The present invention is applicable to various devices for holding plates. In addition to a holding apparatus for holding semiconductor wafers, the present invention is applicable as a groove structure in a cassette for storing wafers and a convey boat.

In this case, as shown in FIG. 5, when a plurality of grooves 25 are formed by a plurality of flat surfaces 25a and opposite inclined surfaces 25b in a cassette or boat, the same effect as in the above embodiment can be obtained. Equipment which employs the present invention can hold wafers 1 without offset values. When the present invention is also applied to devices arranged at the inlet and outlet sides of the above equipment to transfer wafers 1, no transfer allowance is permitted and smooth transfer may not be performed. Therefore, it is preferable to hold the wafers in the inlet- and outlet-side devices with a given allowance.

According to the present invention as has been described above, the plates can be positioned and held with high precision. In addition, the holding apparatus has versatility for allowing holding of plates even if their sizes and thicknesses are changed.

Furthermore, the frictional force produced between the holding portion reaction point and the opposite surface serves as a restraint force for the plates. Therefore, a plate convey apparatus which can withstand vibrations can be obtained.

The holding capacity of plates can cover the range from the vertical to the horizontal state with higher precision than that of the conventional apparatus. Therefore, the plate holding apparatus according to the present invention can be used in a variety of applications.

What is claimed is:

1. A holding apparatus for a plate-like member comprising:
   first holding means having a flat surface; and
   second holding means having an inclined surface which is spaced apart from said flat surface by a predetermined distance and cooperates with said flat surface to receive one end portion of the plate-like member, said inclined surface being inclined such that a distance between said inclined surface and said flat surface is deceased in a plate insertion direction, thereby clamping said one end portion of the plate between said inclined surface and said flat surface to hold the plate-like member along said flat surface; wherein said inclined surface of said second holding means has a pair of reaction points which are brought into contact with edge portions of the plate-like member and spaced apart from each other by a predetermined interval in a direction perpendicular to the plate insertion direction.

2. An apparatus according to claim 1, wherein said flat surface has a vertical surface which is brought into contact with one major surface of the plate-like member and vertically holds the plate.

3. An apparatus for holding a plate having an arcuated one edge, comprising:
   a first holding member having a flat surface; and
   a pair of second holding members having inclined surfaces which are spaced apart from said flat surface by a predetermined distance, and cooperate with said flat surface to receive the arcuated one edge of the plate, said second holding members being spaced apart from each other in a direction perpendicular to a plate insertion direction, said inclined surfaces being inclined such that a distance between said inclined surfaces and said flat surface is decreased in the plate insertion direction, thereby clamping the arcuated one edge portions of said plate and holding the plate along said flat surface.

4. An apparatus for holding a semiconductor wafer having an arcuated edge, a process surface, and a non-process surface, comprising:
   a first holding member having a flat surface which is brought into contact with the nonprocess surface of said semiconductor wafer;
   a pair of second holding members having inclined surfaces which are spaced apart from said flat surface by a predetermined distance, and cooperate with said flat surface to receive the arcuated edge of the semiconductor wafer, said second holding members being spaced apart from each other in a direction perpendicular to a semiconductor wafer insertion direction, said inclined surfaces being inclined such that a distance between said inclined surfaces and said flat surface is decreased in the semiconductor wafer insertion direction, thereby clamping said arcuated edge portions of said semiconductor wafer; and means for fixing said second holding members to said first holding member.

5. An apparatus according to claim 4, further including means for vertically moving said first and second holding means while the semiconductor wafer is kept held vertically.

* * * * *